US006555478B2

United States Patent
Trivedi

(10) Patent No.: US 6,555,478 B2
(45) Date of Patent: Apr. 29, 2003

(54) STACKED LOCAL INTERCONNECT STRUCTURE AND METHOD OF FABRICATING SAME

(75) Inventor: Jigish D. Trivedi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/050,630

(22) Filed: Jan. 15, 2002

(65) Prior Publication Data

US 2002/0068397 A1 Jun. 6, 2002

Related U.S. Application Data

(60) Continuation of application No. 09/892,956, filed on Jun. 27, 2001, now Pat. No. 6,482,689, which is a division of application No. 09/710,399, filed on Nov. 9, 2000.

(51) Int. Cl.[7] .............................................. H01L 21/311
(52) U.S. Cl. ........................................................ 438/700
(58) Field of Search ................................ 438/397, 702, 438/703, 622, 694, 695, 761, 700

(56) References Cited

U.S. PATENT DOCUMENTS

| 3,904,454 A | 9/1975 | Magdo et al. |
| 4,543,707 A | 10/1985 | Ito et al. |
| 4,789,648 A | 12/1988 | Chow et al. |
| 4,808,552 A | 2/1989 | Anderson |
| 5,013,680 A | 5/1991 | Lowrey et al. |
| 5,030,585 A | 7/1991 | Gonzalez et al. |
| 5,049,517 A | 9/1991 | Liu et al. |
| 5,061,650 A | 10/1991 | Dennison et al. |
| 5,061,651 A | 10/1991 | Ino |
| 5,068,199 A | 11/1991 | Sandhu |
| 5,077,238 A | 12/1991 | Fujii et al. |
| 5,082,797 A | 1/1992 | Chan et al. |
| 5,091,339 A | 2/1992 | Carey |
| 5,110,752 A | 5/1992 | Lu |
| 5,134,085 A | 7/1992 | Gilgen et al. |
| 5,135,881 A | 8/1992 | Saeki |
| 5,138,411 A | 8/1992 | Sandhu |
| 5,150,276 A | 9/1992 | Gonzalez et al. |
| 5,162,248 A | 11/1992 | Dennison et al. |
| 5,164,337 A | 11/1992 | Ogawa et al. |
| 5,168,073 A | 12/1992 | Gonzalez et al. |

(List continued on next page.)

FOREIGN PATENT DOCUMENTS

| EP | 0557590 | 9/1993 |
| JP | 63-253661 | 10/1988 |
| JP | 2-275665 | 11/1990 |
| JP | 4-69964 | 3/1992 |
| JP | 5-129548 | 5/1993 |
| JP | 5-315566 | 11/1993 |

OTHER PUBLICATIONS

Abstract, EP000557590A1, 1993 Derwent Publications Ltd., 2 pages.

(List continued on next page.)

*Primary Examiner*—David Nelms
*Assistant Examiner*—Thao P. Le
(74) *Attorney, Agent, or Firm*—TraskBritt

(57) ABSTRACT

A method of forming stacked local interconnects that do not extend into higher levels within a multilevel IC device for economizing space available within the IC device and increasing design flexibility. In one embodiment, the method of the present invention provides a stacked local interconnect which electrically connects a first group of interconnected electrical features with one or more additional isolated groups of interconnected electrical features or one or more isolated individual electrical features. In a second embodiment, the method of the present invention provides a stacked local interconnect which electrically connects an individual electrical feature to one or more additional isolated electrical features.

3 Claims, 15 Drawing Sheets

U.S. PATENT DOCUMENTS

| | | |
|---|---|---|
| 5,170,233 A | 12/1992 | Liu et al. |
| 5,185,282 A | 2/1993 | Lee et al. |
| 5,206,787 A | 4/1993 | Fujioka |
| 5,227,651 A | 7/1993 | Kim et al. |
| 5,229,314 A | 7/1993 | Okudaira et al. |
| 5,238,862 A | 8/1993 | Blalock et al. |
| 5,240,871 A | 8/1993 | Doan et al. |
| 5,244,837 A | 9/1993 | Dennison |
| 5,270,241 A | 12/1993 | Dennison et al. |
| 5,292,677 A | 3/1994 | Dennison |
| 5,338,700 A | 8/1994 | Dennison et al. |
| 5,340,763 A | 8/1994 | Dennison |
| 5,340,765 A | 8/1994 | Dennison et al. |
| 5,354,705 A | 10/1994 | Mathews et al. |
| 5,354,711 A | 10/1994 | Heitzmann et al. |
| 5,362,666 A | 11/1994 | Dennison |
| 5,436,183 A | 7/1995 | Davis et al. |
| 5,447,878 A | 9/1995 | Park et al. |
| 5,457,063 A | 10/1995 | Park |
| 5,459,094 A | 10/1995 | Jun |
| 5,478,772 A | 12/1995 | Fazan |
| 5,491,356 A | 2/1996 | Dennison et al. |
| 5,494,841 A | 2/1996 | Dennison et al. |
| 5,508,223 A | 4/1996 | Tseng |
| 5,518,948 A | 5/1996 | Walker |
| 5,519,238 A | 5/1996 | Lu |
| 5,563,762 A * | 10/1996 | Leung et al. ............ 361/301.4 |
| 5,597,756 A | 1/1997 | Fazan et al. |
| 5,612,254 A | 3/1997 | Mu et al. |
| 5,623,243 A | 4/1997 | Watanabe et al. |
| 5,652,165 A | 7/1997 | Lu et al. |
| 5,654,238 A | 8/1997 | Cronin et al. |
| 5,654,589 A | 8/1997 | Huang et al. |
| 5,702,968 A | 12/1997 | Chen |
| 5,798,568 A | 8/1998 | Abercrombie et al. |
| 5,847,463 A | 12/1998 | Trivedi et al. |
| 5,874,756 A | 2/1999 | Ema et al. |
| 5,886,411 A | 3/1999 | Kohyama |
| 5,907,781 A | 5/1999 | Chen et al. |
| 5,926,709 A | 7/1999 | Aisou et al. |
| 5,932,491 A | 8/1999 | Wald et al. |
| 5,933,364 A | 8/1999 | Aoyama et al. |
| 5,945,707 A | 8/1999 | Bronner et al. |
| 5,946,566 A | 8/1999 | Choi |
| 5,946,571 A | 8/1999 | Hsue et al. |
| 5,970,375 A | 10/1999 | Gardner et al. |
| 5,981,380 A | 11/1999 | Trivedi et al. |
| RE36,644 E | 4/2000 | Dennison |
| 6,063,656 A | 5/2000 | Clampitt |
| 6,187,615 B1 | 2/2001 | Kim et al. |
| 6,207,546 B1 * | 3/2001 | Chen et al. ................ 438/612 |
| 6,291,281 B1 | 9/2001 | Wang et al. |
| 6,303,999 B1 * | 10/2001 | Ro et al. .................... 257/781 |

OTHER PUBLICATIONS

European Search Report, EP 92 12 0331, Apr. 29, 2993, 4 pages.

Itoh, H., et al. "Two Step Deposited Rugged Surface (TDRS) Storagenode and Self Aligned Bitline–Contact Penetrating Cellplate (SABPEC) for 64 MbDRAM STC Cell," IEEE Symposium on VLSI Technology, pp. 9–10, 1991.

Kawamoto, Y., et al. "A 1.28 $\mu m^2$ Bit–Line Shielded Memory Cell Technology for 64Mb DRAMs," Symposium on VLSI Technology, pp. 13–14, 1990.

Patent Abstracts of Japan, No. JP 02203557A2, http://www.delphion.com./cgi–bin/viewpat.cmd/JP02203557A2, Apr. 20, 2001, 4 pages.

Patent Abstracts of Japan, No. JP02166760A2, http://www-.delphion.com./cgi–bin/viewpat.cmd/JP02166760A2, Apr. 20, 2001, 4 pages.

Patent Abstracts of Japan, No. JP03266460A2, http://www-.delphion.com./cgi–bin/viewpat.cmd/JP03266460A2, Apr. 20, 2001, 4 pages.

Shibata, H. et al., "A Novel Zero–Overlap/Enclosure Metal Interconnection Technology for High Density Logic VLSI's," IEEE VMIC Conference, pp. 15–21, 1990.

Woo, S.H., et al., "Selective Etching Technology of in–situ P Doped Poly–Si (SEDOP) for High Density DRAM Capacitors," IEEE Symposium on VLSI Technology Digest of Technical Papers, pp. 25–26, 1994.

* cited by examiner

STACKED LOCAL INTERCONNECT STRUCTURE AND METHOD OF FABRICATING SAME

CROSS-REFERENCE TO RELATED APPLICATION

This application is a continuation of application Ser. No. 09/892,956, filed Jun. 27, 2001, now U.S. Pat. No. 6,482,689, issued Nov, 19, 2002, which is a divisional of application Ser. No. 09/710,399, filed Nov. 9, 2000, pending.

BACKGROUND OF THE INVENTION

1. Field of the Invention

The present invention relates to local interconnect structures included in integrated circuit semiconductor devices. Specifically, the present invention relates to a method of forming stacked local interconnects as well as a method of using local interconnect structures to protect underlying device features from shooting during fabrication of an integrated circuit semiconductor device.

2. State of the Art

Higher performance and decreased size of integrated circuit ("IC") semiconductor devices are constant goals of the semiconductor industry. Both goals are generally achieved by decreasing feature dimensions while increasing the density with which the electrical components that form the semiconductor devices are packaged. As is well known, state of the art semiconductor devices, such as static random-access memory (SRAM) devices and logic circuits, include device features well below 0.25 μm in size and make use of multiple metallization levels as well as local interconnects in order to achieve desired packaging densities.

Local interconnects are often used to electrically connect localized electrical features, such as transistors or other circuit components, formed at a given level within a semiconductor device. Use of local interconnects greatly reduces the area necessary to form a given number of electrical features within a semiconductor device, thereby reducing the total size of the semiconductor device itself. However, as is also well known, it is often desirable to electrically connect two or more electrical features which are isolated within a given level of a multilevel semiconductor device. As used herein, the term "isolated" identifies electrical features which are remotely located within a single level, separated by one or more unrelated electrical features included in the same level, or both remotely located and separated by one or more unrelated electrical features. In order to electrically connect such isolated electrical features, multilevel interconnect structures, which include one or more metallization layers formed at higher levels within a semiconductor device, and the isolated electrical features are electrically connected via a multilevel interconnect structure by extending contact plugs up from the isolated features to the metallization layers included in the multilevel interconnect structure. Because they extend up into higher levels within multilevel semiconductor devices, multilevel interconnect structures allow connection of isolated electronic features using complex interconnect structures without shooting to any unrelated electrical features that may exist between the isolated features being electrically connected.

Electrically connecting isolated electrical features using multilevel interconnects, however, has significant disadvantages. For example, forming multilevel interconnects at higher elevations within a semiconductor device complicates the design of higher levels occupied by the multilevel interconnect structures, thereby reducing design flexibility at the higher levels and, ultimately, increasing the size of the finally formed semiconductor device. Moreover, the methods used to fabricate multilevel interconnects are relatively complicated and generally require the use of enlarged contact pads in order to compensate for fabrication errors, which may occur during the masking or etching steps used to form the contact plugs necessary to electrically connect the isolated electrical features via the multilevel interconnect.

Therefore, a method of electrically connecting isolated electrical features included within the same level of a multilevel semiconductor device, which does not require the formation of multilevel interconnect structures but which protects any intervening, unrelated semiconductor device features, would be advantageous. Such a method would minimize the intrusion of multilevel interconnect structures into higher levels within a multilevel semiconductor device, which, in turn, would increase the area available within such higher layers for fabrication of further electrical features and greatly enhance the design flexibility of state of the art semiconductor devices.

BRIEF SUMMARY OF THE INVENTION

The present invention addresses the foregoing needs by providing a method of forming stacked local interconnects which electrically connect isolated electrical features included within a single level of a multilevel semiconductor device without occupying space at higher levels within the multilevel semiconductor device. In a first embodiment, the method of the present invention provides a stacked local interconnect which electrically connects a first group of interconnected electrical features with one or more additional isolated groups of interconnected electrical features or one or more isolated individual electrical features. In a second embodiment, the method of the present invention provides a stacked local interconnect which electrically connects an individual electrical feature to one or more additional isolated electrical features. Significantly, in each of its embodiments, the method of the present invention does not require formation of contact plugs and, therefore, obviates the disadvantages associated with contact plug formation. Moreover, portions of the stacked local interconnect structures formed in each embodiment of the method of the present invention not only serve to electrically connect isolated device features but also serve to protect underlying, unrelated semiconductor device features from damage during subsequent etch steps. Therefore, the present invention also includes a method for protecting semiconductor device features from damage due to inadvertent etching of such features.

Other features and advantages of the present invention will become apparent to those of skill in the art through a consideration of the ensuing description, the accompanying drawings, and the appended claims.

BRIEF DESCRIPTION OF THE SEVERAL VIEWS OF THE DRAWINGS

The figures presented in conjunction with this description are not actual views of any particular portion of an actual IC device or component but are merely representations employed to more clearly and fully depict the present invention.

DETAILED DESCRIPTION OF THE INVENTION

In a first embodiment, the method of the present invention enables the formation of stacked local interconnects facilitating the electrical connection of a first set of interconnected electrical features to a second set of interconnected electrical features. Significantly, the stacked local interconnects are formed within a single level of a multilevel semiconductor device, thereby simplifying device levels overlying the level occupied by the electrical features which are interconnected by the stacked local interconnects.

Figure 1:
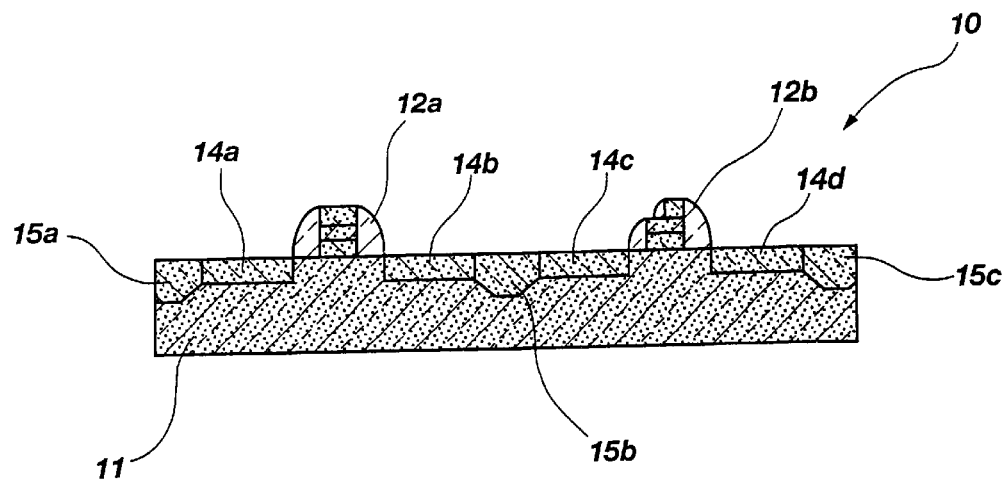
FIG. 1 through FIG. 15 provide schematic illustrations of semiconductor device structures formed while carrying out various steps of the first embodiment of the method of the present invention.

To carry out the first embodiment of the method of the present invention, a first intermediate semiconductor device structure 10 is provided. As is illustrated in drawing FIG. 1, the first intermediate semiconductor device structure 10 includes a semiconductor substrate 11 having desired features, such as transistors 12a, 12b, source and drain regions 14a–14d, isolation regions 15a–15c, or other electrical features or components, already formed thereon. As used herein, the term "semiconductor substrate" signifies any construction including semiconductive material, including, but not limited to, bulk semiconductive material, such as a semiconductive wafer, either alone or in assemblies including other materials, and semiconductive material layers, either alone or in assemblies including other materials. Moreover, in order to ease description of the first embodiment of the present invention, drawing FIG. 1 provides a greatly simplified illustration of a typical first intermediate semiconductor device structure 10. It is well known in the art that an intermediate semiconductor device structure may further include other features necessary for the proper function of the completed semiconductor device, and, as will be easily appreciated from the description provided herein, application of the first embodiment of the method of the present invention is not limited to the simplified schematic representations provided in the accompanying figures.

Figure 2:
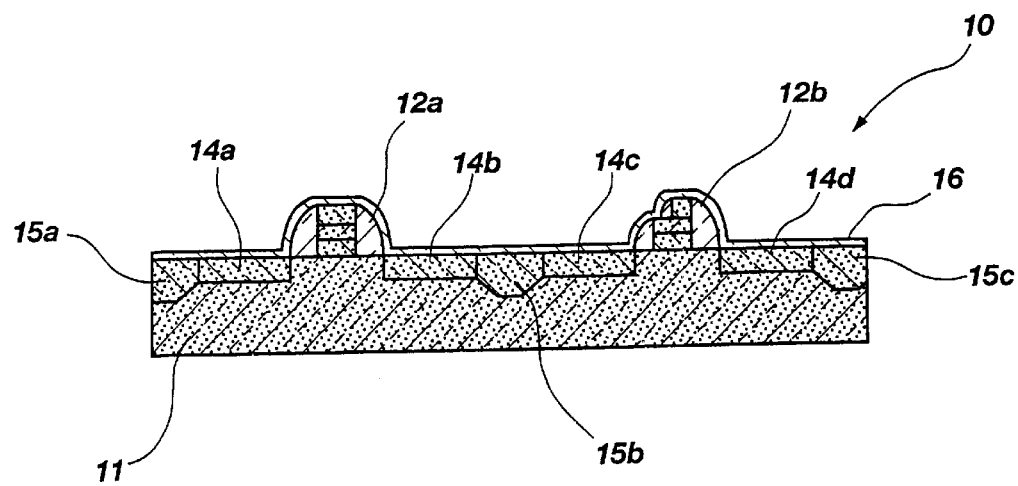

As is shown in drawing FIG. 2, an etch stop layer 16 is formed over the first intermediate semiconductor device structure 10. The etch stop layer 16 may include any suitable material, such as silicon dioxide ($SiO_2$), silicon oxynitride ($Si_xO_yN_2$), tetraethylorthosilicate (TEOS), or silicon nitride ($Si_3N_4$). Further, the etch stop layer may be formed by any well-known means, such as a chemical vapor deposition (CVD) process. Preferably, the etch stop layer 16 includes a layer of $Si_xO_yN_2$ deposited by a plasma-enhanced CVD process. The etch stop layer 16 protects the various features included on the semiconductor substrate 11, such as the transistors 12a, 12b, from degradation or damage during subsequent etch steps used to define desired local interconnects. Moreover, the etch stop layer 16 may additionally serve as a barrier layer, substantially preventing diffusion of contaminants from overlying material layers into the semiconductor substrate 11 or any features included on the semiconductor substrate 11.

Figure 3:
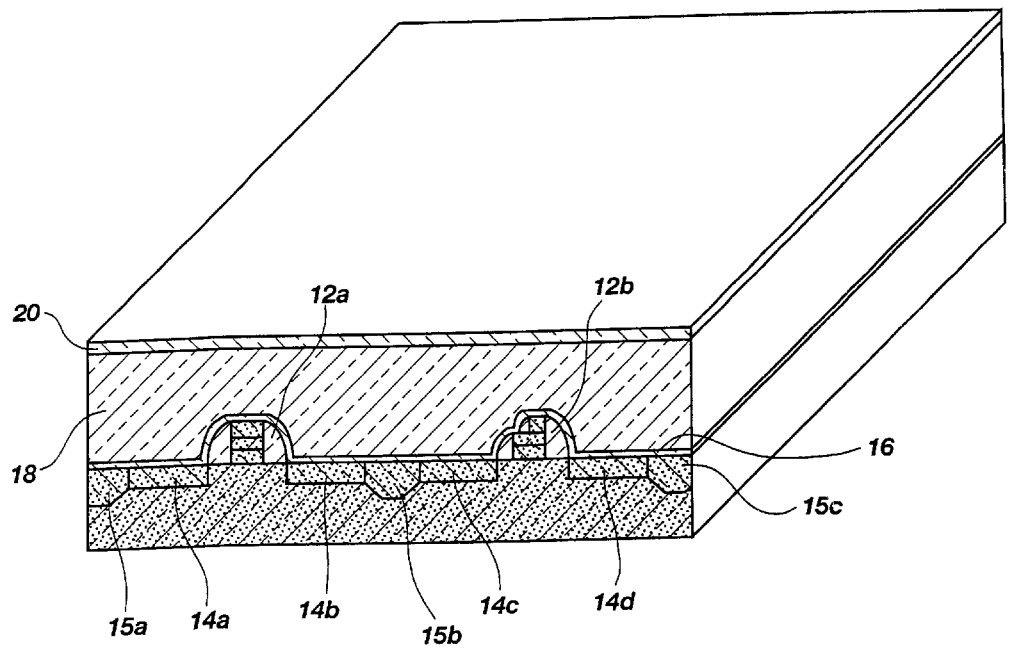

After formation of the etch stop layer 16, a passivation layer 18 and an interlayer dielectric (ILD) 20 are formed over the etch stop layer 16 (shown in drawing FIG. 3). The passivation layer 18 may be composed of known silica materials, such as $SiO_2$, borophosphosilicate glass (BPSG), phosphosilicate glass (PSG), borosilicate glass (BSG), or doped or undoped oxide materials. BPSG is the presently preferred passivation material, and where BPSG is used, the passivation layer 18 may be formed by depositing a layer of BPSG and utilizing known reflow or polishing techniques to achieve a passivation layer 18 having a desired thickness and planarity. The ILD 20 may include any suitable dielectric material, such as $SiO_2$, $Si_xO_yN_2$, or, preferably, $Si_3N_4$. Again, the ILD material may be formed by any known process, such as known CVD processes.

Figure 4:
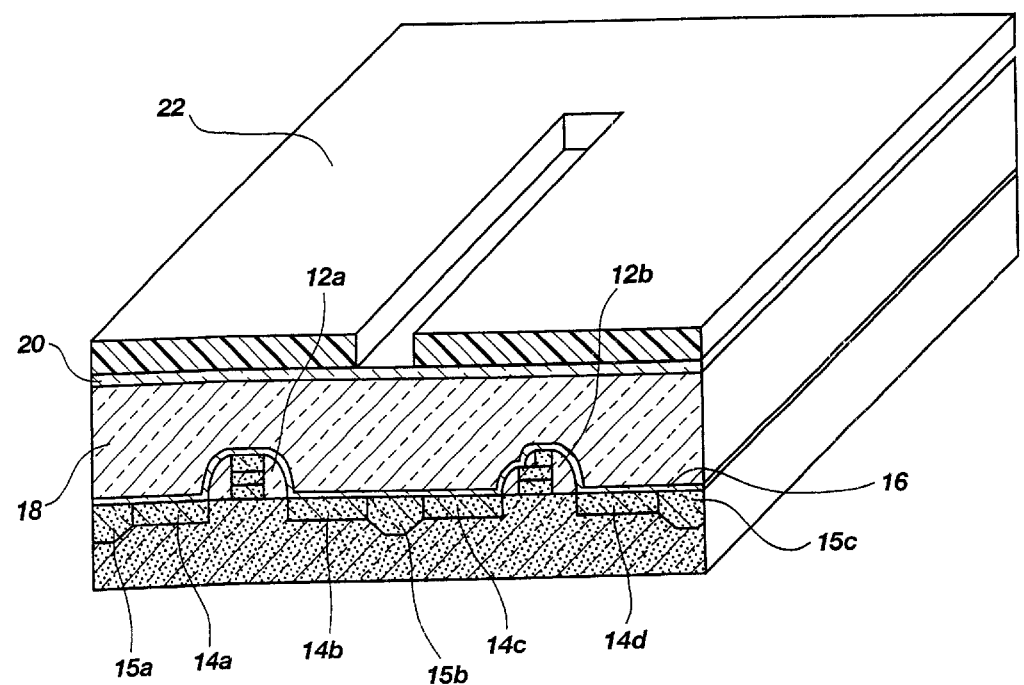

As can be seen in drawing FIG. 4, after formation of the passivation layer 18 and the ILD 20, a first resist 22 is formed over the ILD 20. Any desirable resist material may be used to form the first resist 22, and, as can also be appreciated from drawing FIG. 4, the first resist 22 is exposed and developed according to well-known processes to define a pattern corresponding in size, shape, and location to a desired first local interconnect.

Figure 5:
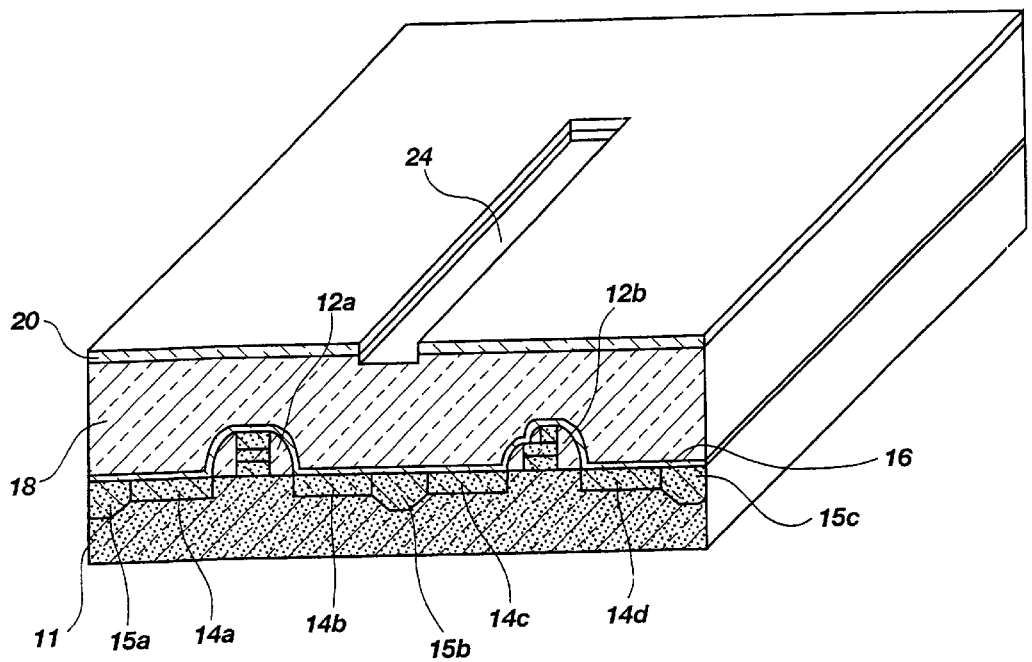

Using the pattern defined in the first resist 22, the ILD 20 is etched to define a trench 24 into the ILD 20. The trench 24 will enclose and define the first local interconnect. Though any suitable etch process may be used, a dry plasma etch process is preferred. Because it is difficult to precisely control the depth of the ILD 20 etch, it is likely that the trench 24 will extend at least slightly into the passivation layer 18, as is shown in drawing FIG. 5. After formation of the trench 24, the first resist 22 is stripped using means known in the art.

Figure 6:
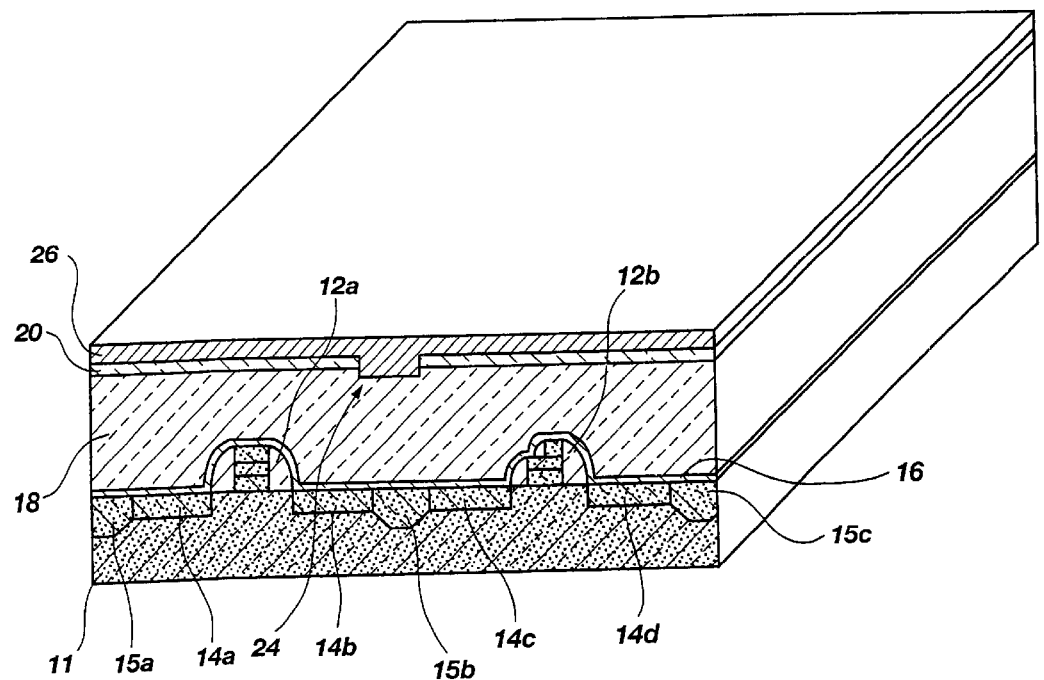
Figure 7:
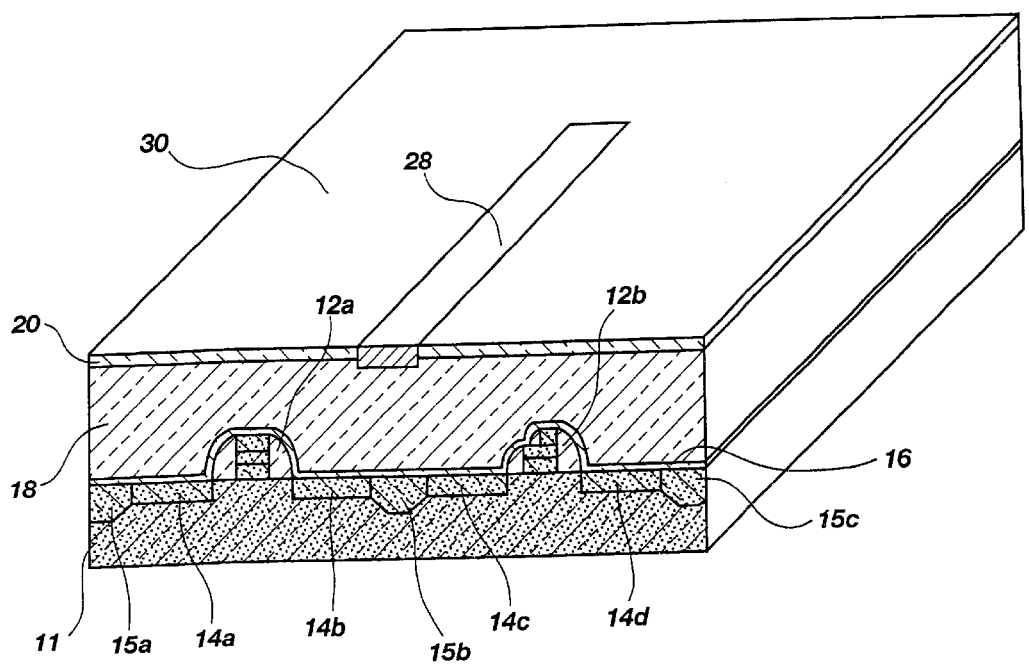

The trench 24 is then filled with a desired conductive material. As is illustrated in drawing FIG. 6, in order to fill the trench 24, a layer of conductive material 26, such as tungsten, is formed over the trench 24 and the remaining portions of the ILD 20 by known means, such as a sputter deposition or CVD process. The layer of conductive material layer 26 is then polished as known in the art, such as by a chemical mechanical planarization (CMP) process, to achieve a first local interconnect 28, which extends through the ILD 20 but is substantially coplanar with the top surface 30 of the ILD 20 (shown in drawing FIG. 7).

Figure 8:
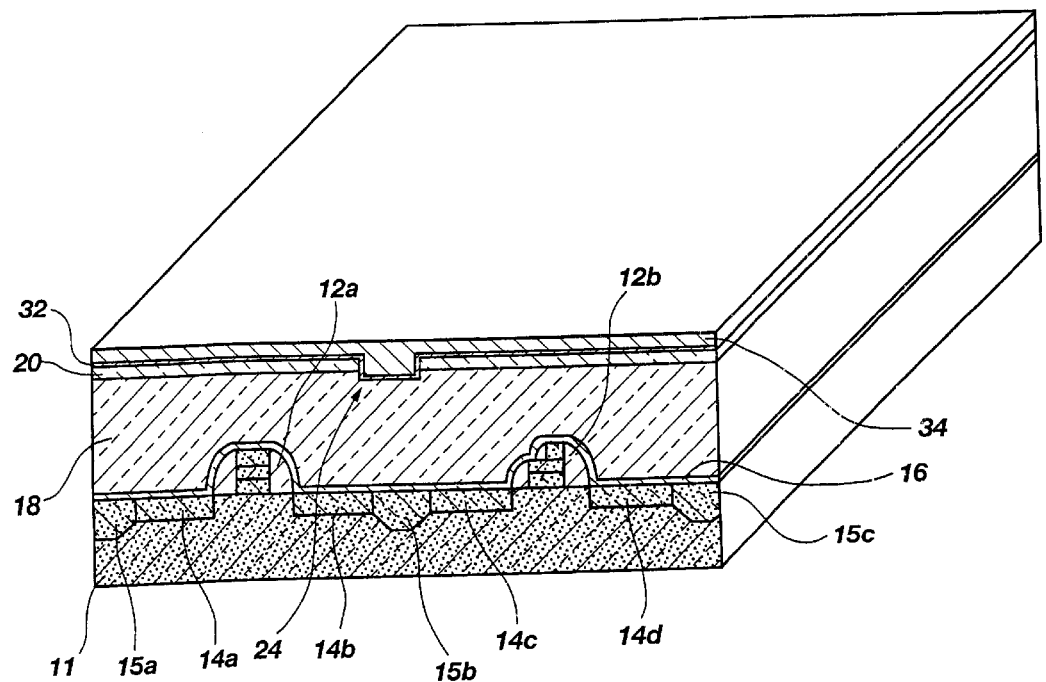
Figure 9:
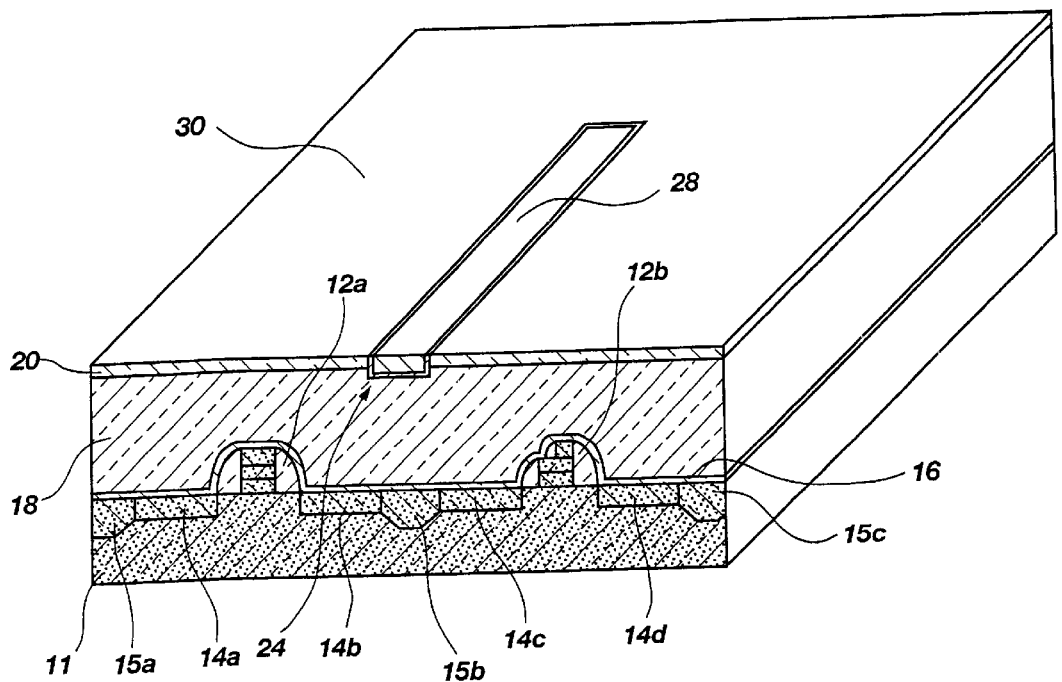

Optionally, where desirable, the trench 24 defining the first interconnect may be filled by first depositing a barrier layer 32 over the trench 24 and remaining portion of the ILD 20. The barrier layer 32 may include a first conductive material, such as titanium, tungsten, tantalum, titanium nitride, tungsten nitride, or tantalum nitride, and the barrier layer is formed by well-known means in the art. As can be seen in drawing FIG. 8, the barrier layer 32 partially fills the trench 24. After formation of the barrier layer 32, a second conductive layer 34 is formed over the barrier layer 32. The second conductive layer 34 may include any suitable material, such as tungsten, and can also be formed using well-known techniques. The barrier layer 32 and the second conductive layer 34 are then polished by suitable means, such as a known CMP process, to again achieve a first local interconnect 28, which extends through the ILD 20 but is substantially coplanar with the top surface 30 of the ILD 20 (shown in drawing FIG. 9).

Regardless of whether the first local interconnect 28 is formed using a barrier layer 32 and a second conductive layer 34 or simply a single layer of conductive material 26, the first local interconnect 28 can be sized, shaped, and positioned as desired. Preferably, however, the local interconnect is sized, shaped, and positioned such that, after formation of the final stacked local interconnect structure (shown in drawing FIG. 13 and drawing FIG. 15), the first local interconnect structure 28 enables the electrical connection of a first group of interconnected electrical features (e.g., transistors 12a and 12b) to one or more additional groups of interconnected electrical features (not illustrated).

Figure 10:
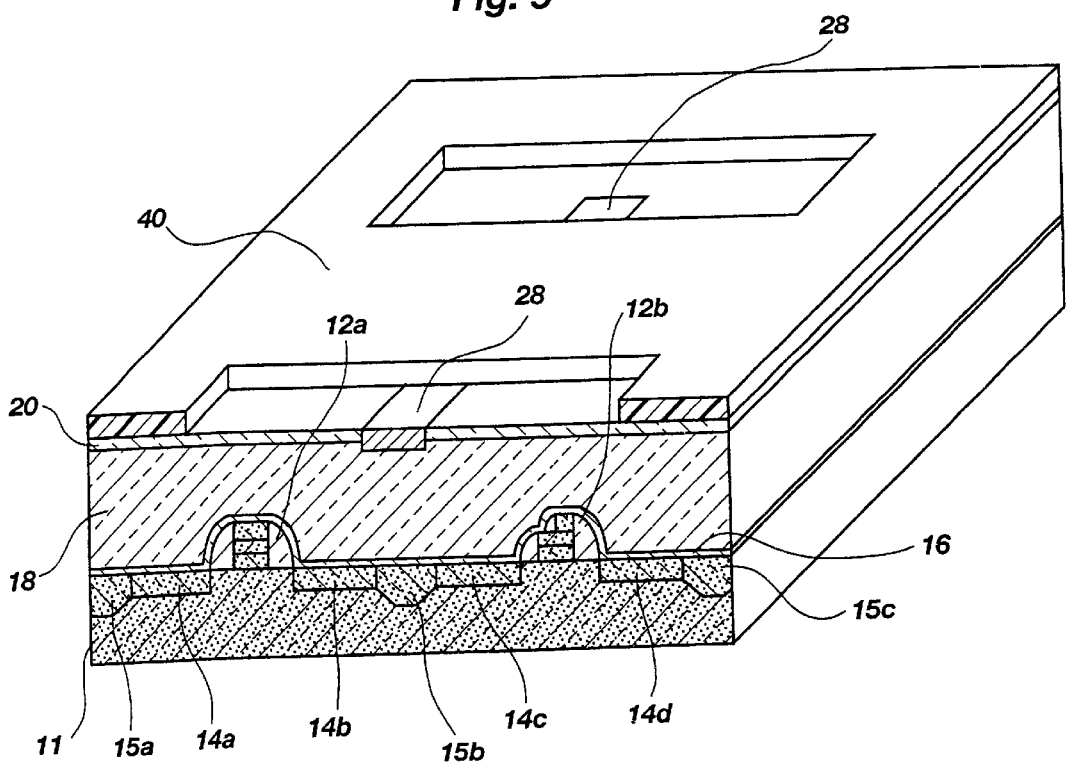

Once the first local interconnect 28 is formed, a second resist 40 is formed over the semiconductor substrate 11, as can be seen in drawing FIG. 10. As was true in regard to the first resist 22, any desirable resist material may be used to form the second resist 40. The second resist 40 is exposed and developed according to well-known processes to define the desired shape and location of the second and third local interconnects, which will complete the stacked local interconnect structure.

Figure 11:
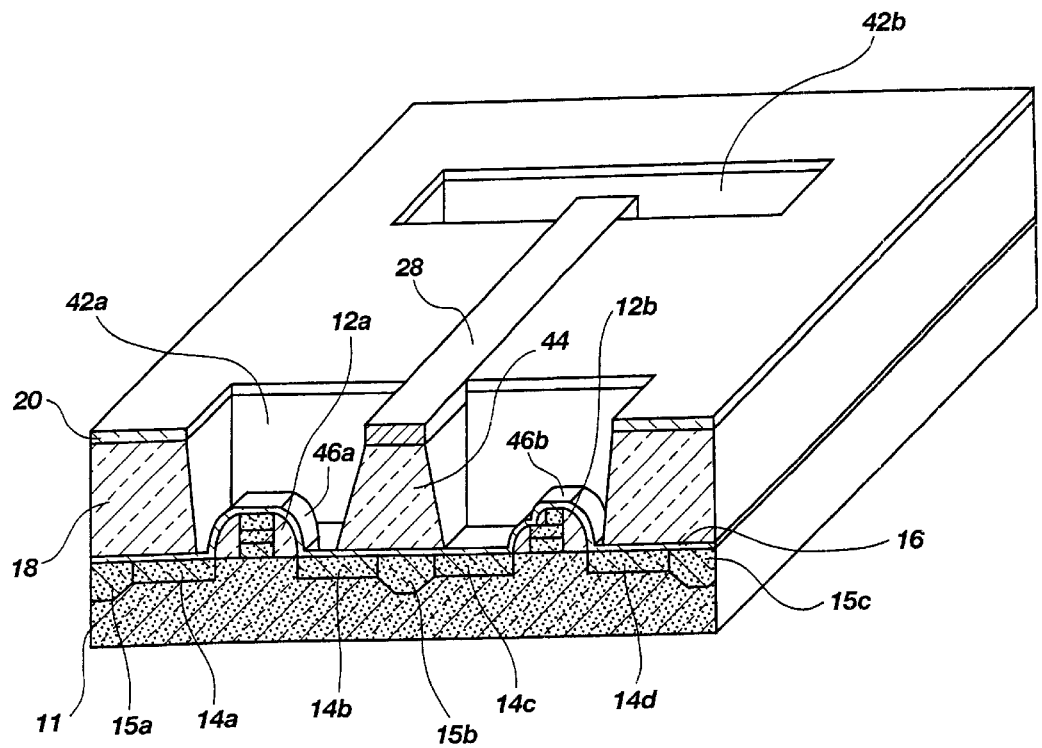

Using the pattern defined in the second resist 40, the ILD 20 and passivation layer 18 are etched to define openings 42a, 42b using a self-aligned contact (SAC) etch, which is selective to the material(s) used in first local interconnect 28 and etch stop layer 16 (FIG. 11). As can be appreciated by reference to drawing FIG. 11, the openings 42a, 42b formed by the SAC etch extend down through the passivation layer 18 and expose each of the electrical features, such as transistors 12a, 12b, which are to be electrically connected. Moreover, because the SAC etch is selective to the material used to form the first local interconnect 28, the portion 44 of the passivation layer 18 underlying the first local interconnect 28 remains intact, providing proper isolation for each of the electrical features to be interconnected, such as transistors 12a and 12b, and protecting any intervening, unrelated electrical features that may be included underneath the first local interconnect 28. After openings 42a, 42b have been formed, the second resist 40 is stripped using means known in the art.

In order that the second and third local interconnects may be formed in electrical contact with the electrical features exposed by openings 42a and 42b, portions of the etch stop layer 16 overlying the electrical features to be interconnected, such as portions 46a and 46b (shown in drawing FIG. 11), are selectively removed by a known etch process. The etch process is preferably a selective plasma dry etch process, such as a "punch etch" process. Illustrated in drawing FIG. 12 is an intermediate semiconductor device structure 10 after portions 46a, 46b of the etch stop layer 16 have been removed by a desirable etch process.

Figure 12:
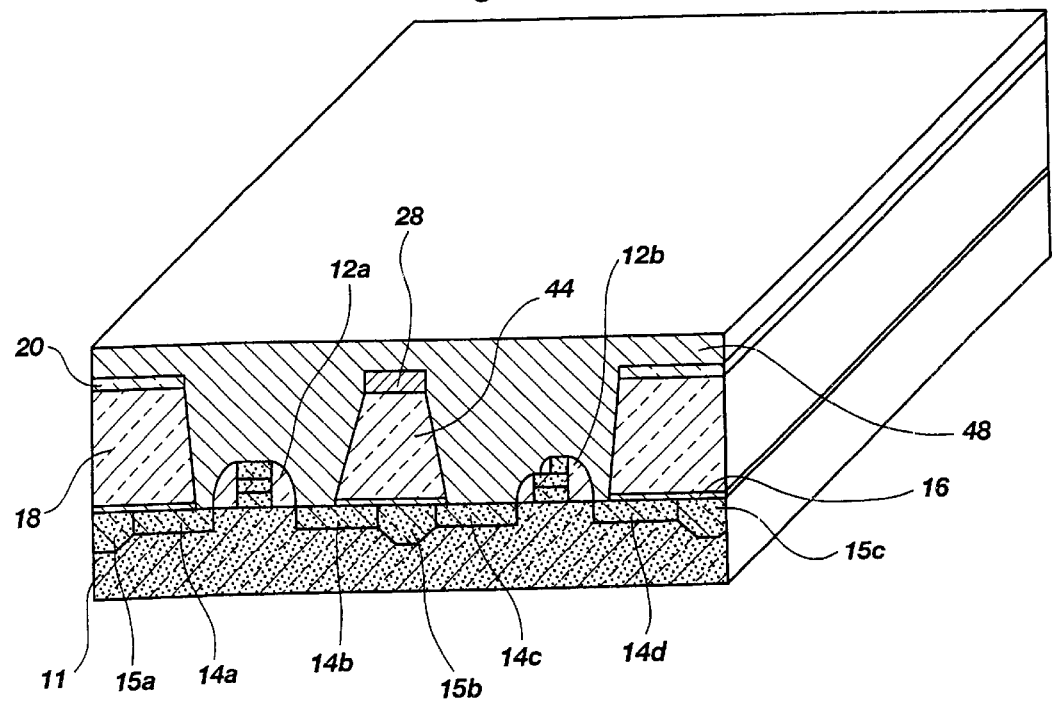

After portions of the etch stop layer 16, such as portions 46a and 46b, have been removed to reveal the electrical features, such as transistors 12a and 12b, to be electrically connected, a layer of conductive material 48 is formed over openings 42a, 42b, the first local interconnect 28, and the remaining portions of the ILD 20 (shown in drawing FIG. 12). The layer of conductive material 48 fills openings 42a and 42b and may include any suitable conductive material, such as tungsten, the presently preferred material. The layer of conductive material 48 may be formed using a known deposition process. As can be appreciated by reference to drawing FIG. 13, the layer of conductive material 48 is then polished as known in the art, such as by a chemical mechanical polishing (CMP) process, to achieve second and third local interconnects 50, 51, which extend through the ILD 20 and passivation layer 18, are in electrical contact with the electronic features, such as transistors 12a and 12b, to be interconnected, are in electrical contact with the first local interconnect 28, and are substantially coplanar with the top surface 30 of the ILD 20 (shown in drawing FIG. 13).

Figure 14:
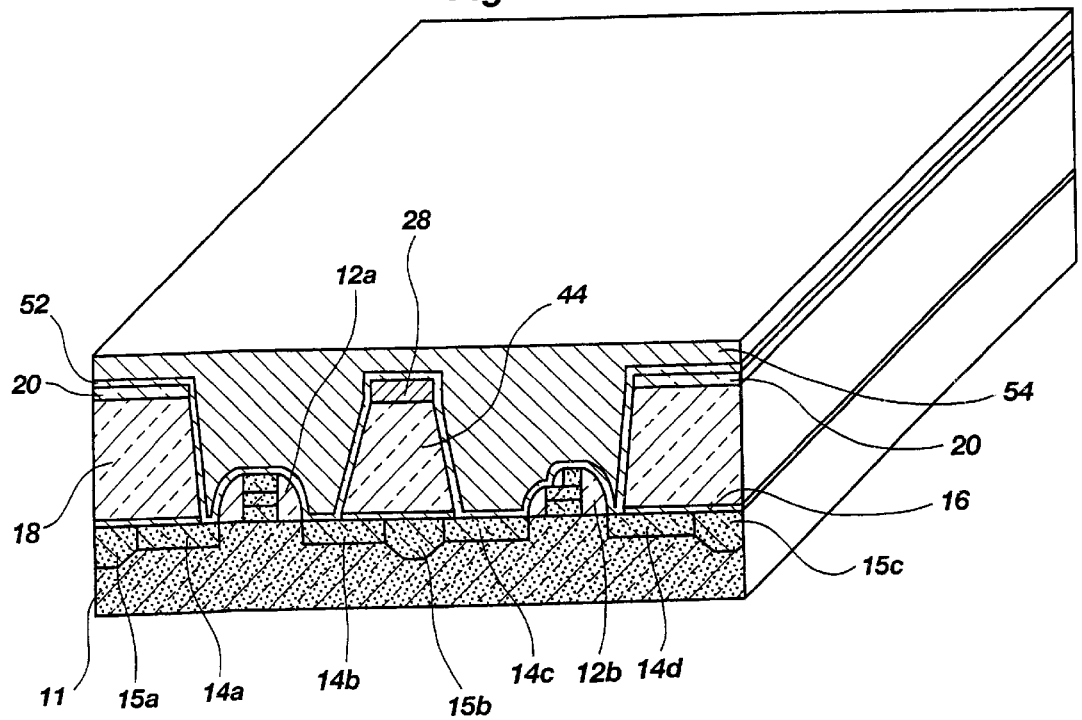
Figure 15:
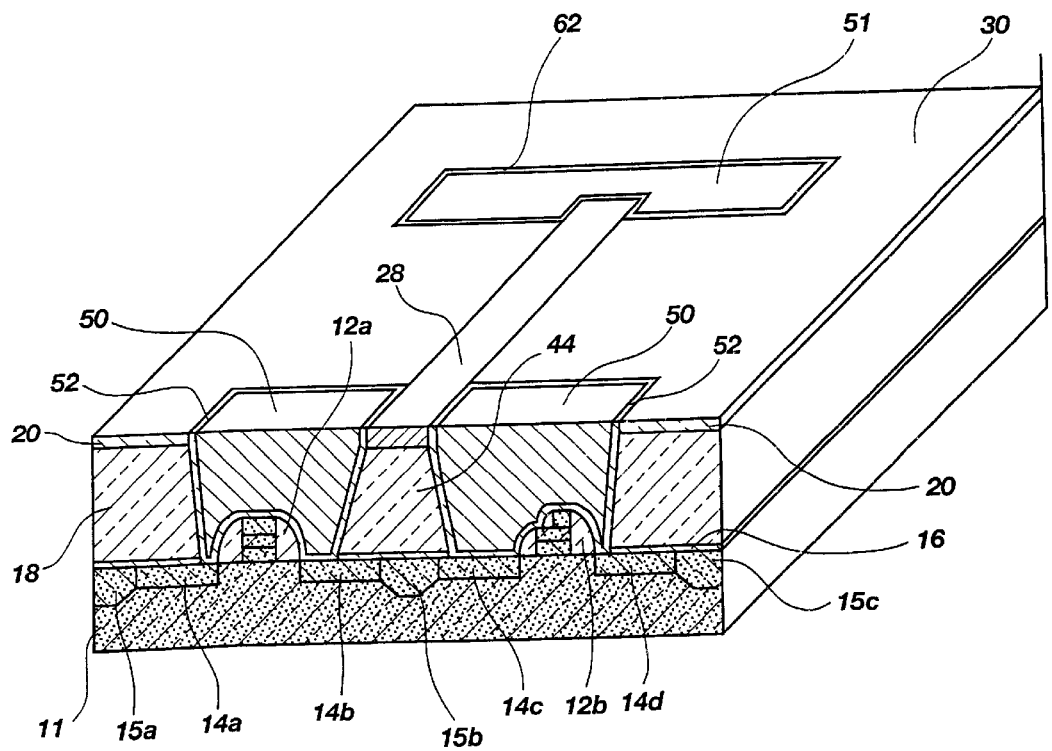

Alternatively, as shown in drawing FIG. 14 and drawing FIG. 15, the second and third local interconnects 50, 51 may also be formed by first depositing a barrier layer 52 comprised of any suitable material, such as those materials already described in regard to first local interconnect 28. As can be seen in drawing FIG. 14, the barrier layer 52 partially fills openings 42a and 42b. After formation of the barrier layer 52, a second conductive layer 54 is formed over the semiconductor substrate 11. The second conductive layer 54, which can be formed using well-known techniques, completely fills openings 42a and 42b and may include any suitable material, such as tungsten. The barrier layer 52 and the second conductive layer 54 are then polished by suitable means, such as a known CMP process, to achieve second and third local interconnects 50, 51, which extend through the ILD 20 and passivation layer 18, are in electrical contact with the electrical features, such as transistors 12a and 12b to be interconnected, are in electrical contact with the first local interconnect 28, and are substantially coplanar with the top surface 30 of the ILD 20 (shown in drawing FIG. 15).

Figure 13:
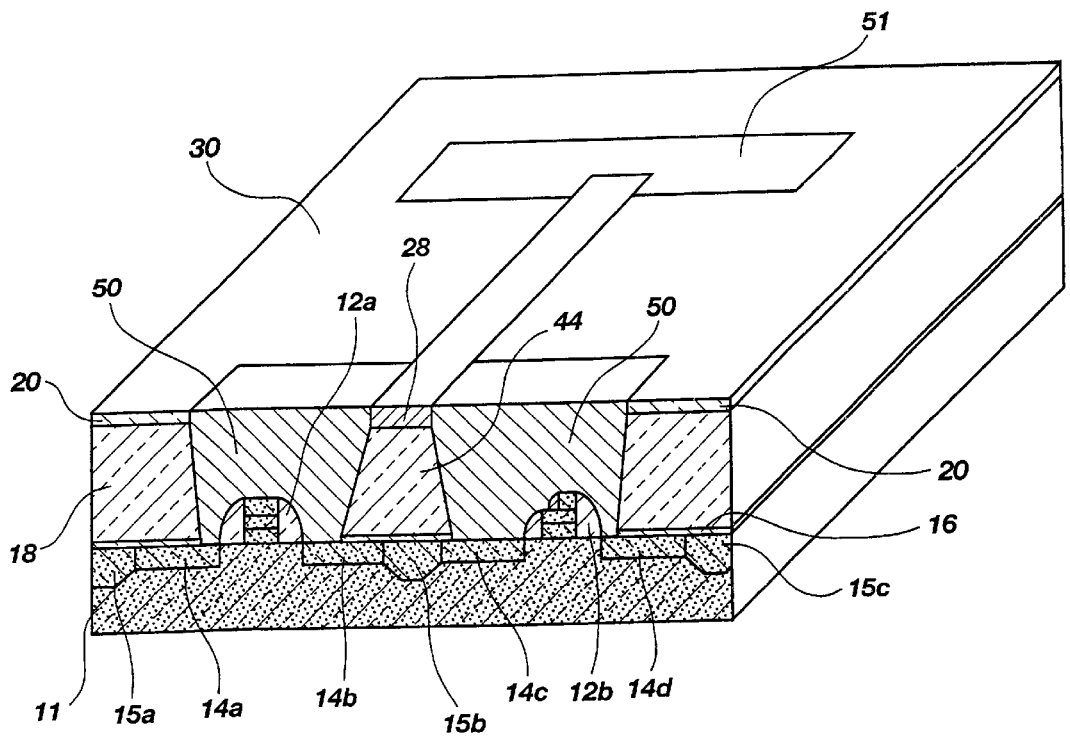

Reference to drawing FIG. 13 and drawing FIG. 15 highlights that the first embodiment of the method of the present invention provides a stacked local interconnect structure formed of a first local interconnect 28, a second local interconnect 50, and a third local interconnect 51, which enables the interconnection of two or more isolated groups of interconnected electrical features included in the same level of a multilevel IC device. For example, as shown in drawing FIG. 13 and drawing FIG. 15, a first group of electrical features, transistors 12a and 12b, is electrically connected by second local interconnect 50, a second set of electrical features (not illustrated) is electrically connected by third local interconnect 51, and the first and second groups of electrical features are electrically connected by first local interconnect 28. Moreover, the stacked local interconnects formed by the first embodiment of the present invention do not include multilevel metallization structures that would otherwise extend into and complicate higher levels included in a multilevel semiconductor device. Finally, the fabrication of the stacked local interconnects is accomplished without contact plugs and the disadvantages that accompany the use of contact plugs, such as the need for enlarged contact pads and extra masking and etching steps. Therefore, the first embodiment of the present invention provides a method for forming stacked local interconnects that facilitate the electrical connection of isolated groups of interconnected electrical features, but the first embodiment of the method of the present invention also substantially reduces or eliminates the disadvantages associated with known multilevel interconnect structures.

Though the first embodiment of the method of the present invention has been described herein with reference to a stacked local interconnect structure including a first local interconnect electrically connecting second and third local interconnects, the first embodiment may be used to form any desired stacked local interconnect structure. For example, instead of a first local interconnect electrically connecting two groups of electrically connected semiconductor device features, the first embodiment of the present invention may be used to form a first local interconnect electrically connecting three or more groups of electrically connected semiconductor device features. Or, alternatively, the first embodiment of the method of the present invention may be used to electrically connect a first group of electrically connected features to one or more individual electrical features. As is easily appreciated from the description provided herein, the first embodiment of the method of the present invention is extremely flexible and provides a means by which a group of interconnected electrical features may be electrically connected to any desired number of isolated interconnected electrical features or individual electrical features without the need for multilevel interconnect semiconductor device structures.

Figure 16:
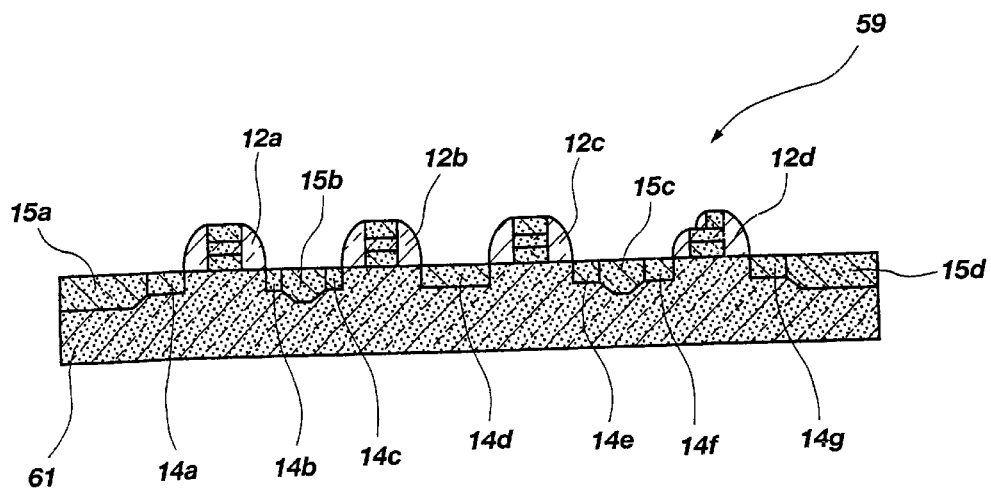
FIG. 16 through FIG. 30 provide schematic illustrations of semiconductor device structures formed while carrying out various steps of the second embodiment of the method of the present invention.

A second embodiment of the method of the present invention is similar to the first embodiment, except that it may be used to electrically connect individual isolated electronic features. As was true in the first embodiment of the method of the present invention, the first step in the second embodiment is providing an intermediate semiconductor device structure 59 (shown in drawing FIG. 16) including a semiconductor substrate 61 having desired electrical features, such as transistors 12a–12d, source and drain regions 14a–14g, or any other desired electrical features formed thereon. Moreover, as was true in the first embodiment of the method of the present invention, the intermediate semiconductor device structure 59 provided may further include any other features, such as field oxide or isolation regions 15a–15d, that may be necessary for the proper function of a completed IC device. Drawing FIG. 16, like FIG. 1, provides a greatly simplified illustration of a typical first intermediate semiconductor device structure 59. As will be easily appreciated from the description provided herein, application of the second embodiment of the method of the present invention is not limited to the simplified schematic representations provided in the accompanying figures.

Figure 17:
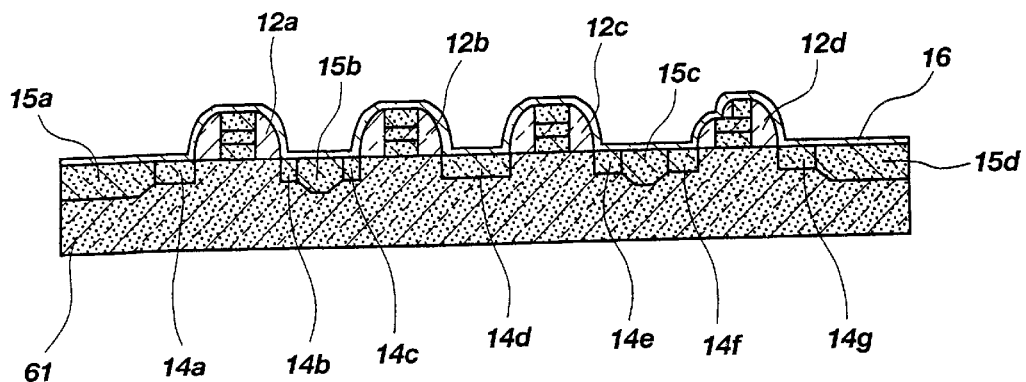

As is shown in drawing FIG. 17, an etch stop layer 16 is formed over the first intermediate semiconductor device structure 59. The etch stop layer 16 may include any suitable material, such as silicon dioxide ($SiO_2$), silicon oxynitride ($Si_xO_yN_2$), tetraethylorthosilicate (TEOS), or silicon nitride ($Si_3N_4$). Further, the etch stop layer may be formed by any well-known means, such as a chemical vapor deposition (CVD) process. Preferably, the etch stop layer 16 includes a layer of $Si_xO_yN_2$ deposited by a plasma-enhanced CVD process. The etch stop layer 16 protects the various features included on the semiconductor substrate 61, such as the transistors 12a–12d, from degradation or damage during subsequent etch steps used to define desired local interconnects. Moreover, the etch stop layer 16 may additionally serve as a barrier layer, substantially preventing diffusion of contaminants from overlying material layers into the semiconductor substrate 61 or any features included on the semiconductor substrate 61.

Figure 18:
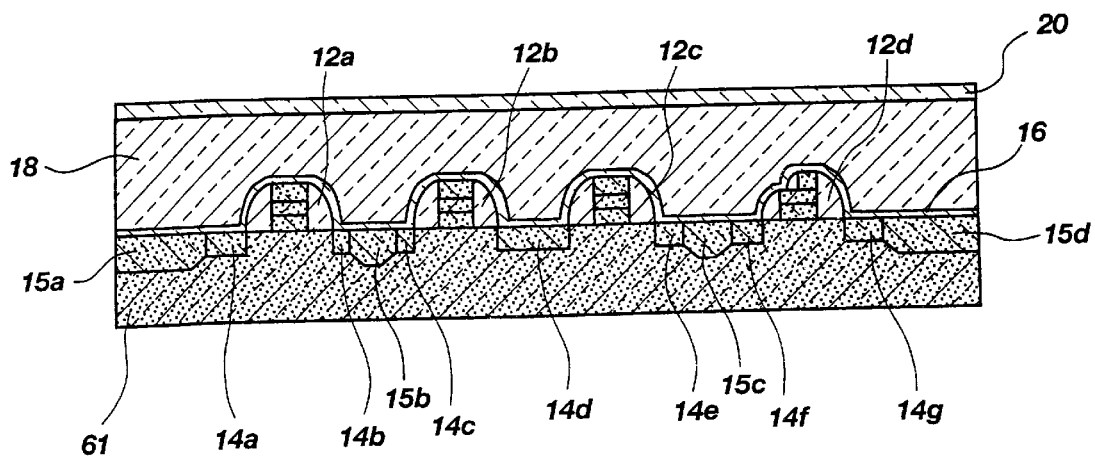

After formation of the etch stop layer 16, a passivation layer 18 and an interlayer dielectric (ILD) 20 are formed over the etch stop layer 16 (shown in drawing FIG. 18). The passivation layer 18 may be composed of known silica materials, such as $SiO_2$, borophosphosilicate glass (BPSG), phosphosilicate glass (PSG), borosilicate glass (BSG), or doped or undoped oxide materials. BPSG is the presently preferred passivation material, and where BPSG is used, the passivation layer 18 may be formed by depositing a layer of BPSG and polishing the BPSG layer, using known polishing techniques, to achieve a passivation layer 18 having a desired thickness and planarity. The ILD 20 may include any suitable dielectric material, such as $SiO_2$, $Si_xO_yN_2$, or, preferably, $Si_3N_4$, and, again, the ILD material may be formed by any known process, such as known CVD processes.

Figure 19:
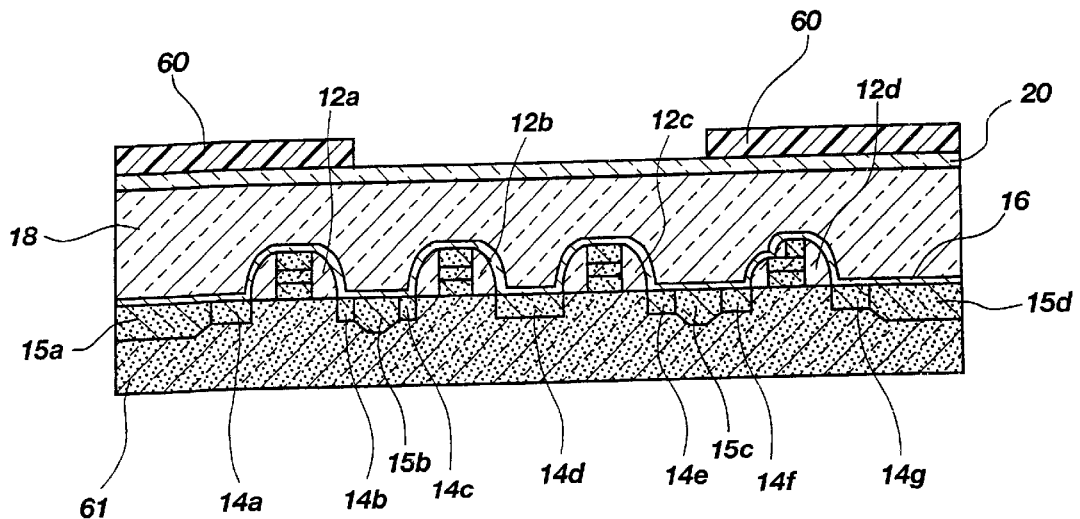

As can be seen in drawing FIG. 19, after formation of the passivation layer 18 and the ILD 20, a first resist 60 is formed over the ILD 20. Any desirable resist material may be used to form the first resist 60, and, as can also be appreciated from drawing FIG. 19, the first resist 60 is exposed and developed according to well-known processes to define a pattern corresponding in size, shape, and location to a first portion of the desired stacked local interconnect.

Figure 20:
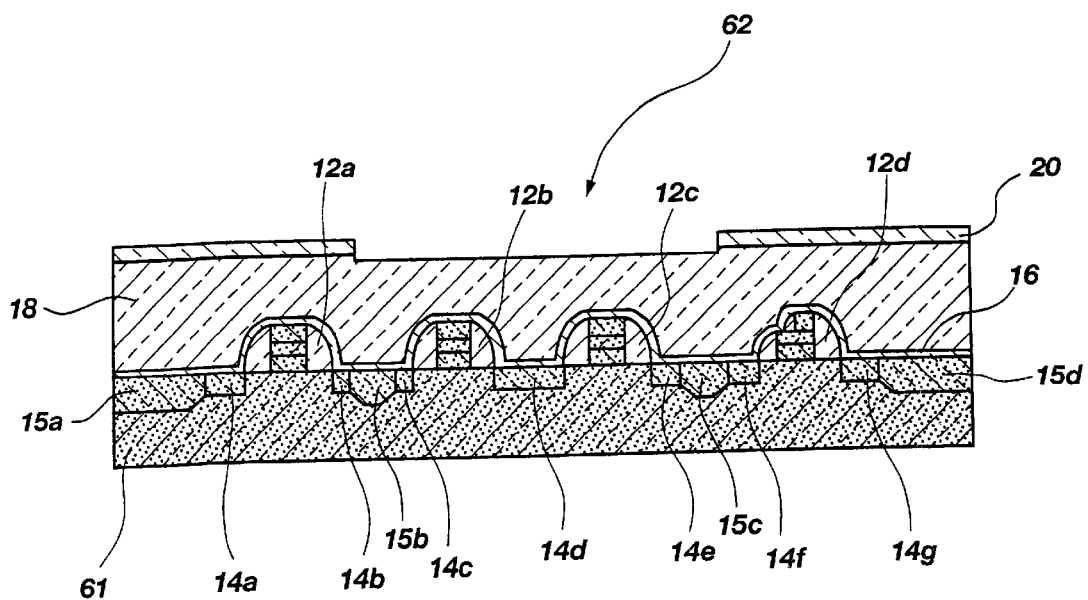

Using the pattern defined in the first resist 60, the ILD 20 is etched to define a trench 62 into the ILD 20, which will enclose and define the first portion of the stacked local interconnect. Though any suitable etch process may be used, a dry plasma etch is preferred. Because it is difficult to precisely control the depth of the ILD 20 etch, it is likely that the trench 62 will extend at least slightly into the passivation layer 18, as is shown in drawing FIG. 20.

Figure 21:
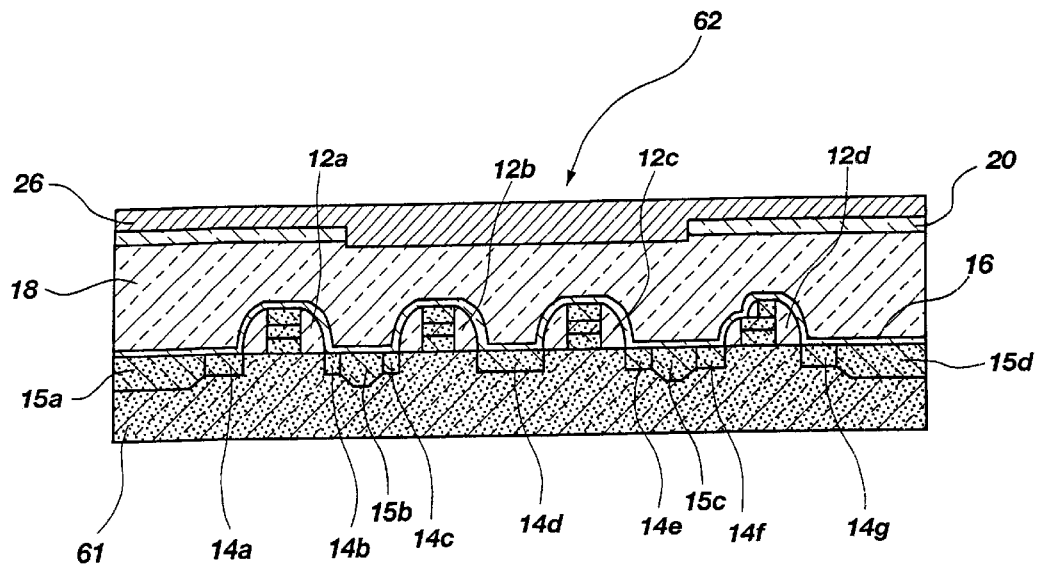
Figure 22:
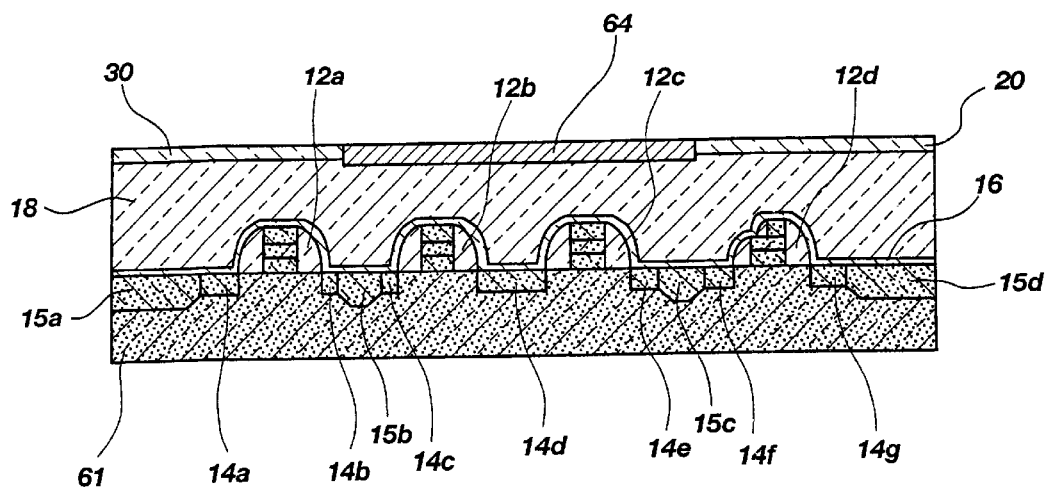

The trench 62 is then filled with a desired conductive material. As is illustrated in FIG. 21, in order to fill the trench 62, a layer of conductive material 26, such as tungsten, is formed over the trench 62 and the remaining portions of the ILD 20 by known means, such as a sputter deposition or CVD process. The deposited conductive material layer 26 is then polished as known in the art, such as by a chemical mechanical polishing (CMP) process, to achieve a first portion 64 of the stacked local interconnect, which extends through the ILD 20, but is substantially coplanar with the top surface 30 of the ILD 20 (shown in drawing FIG. 22).

Figure 23:
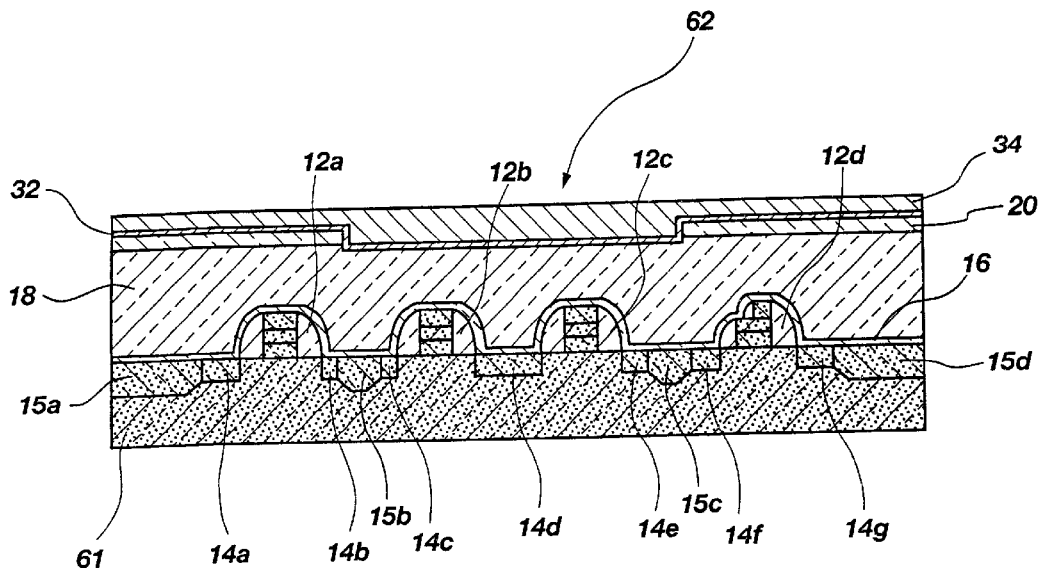
Figure 24:
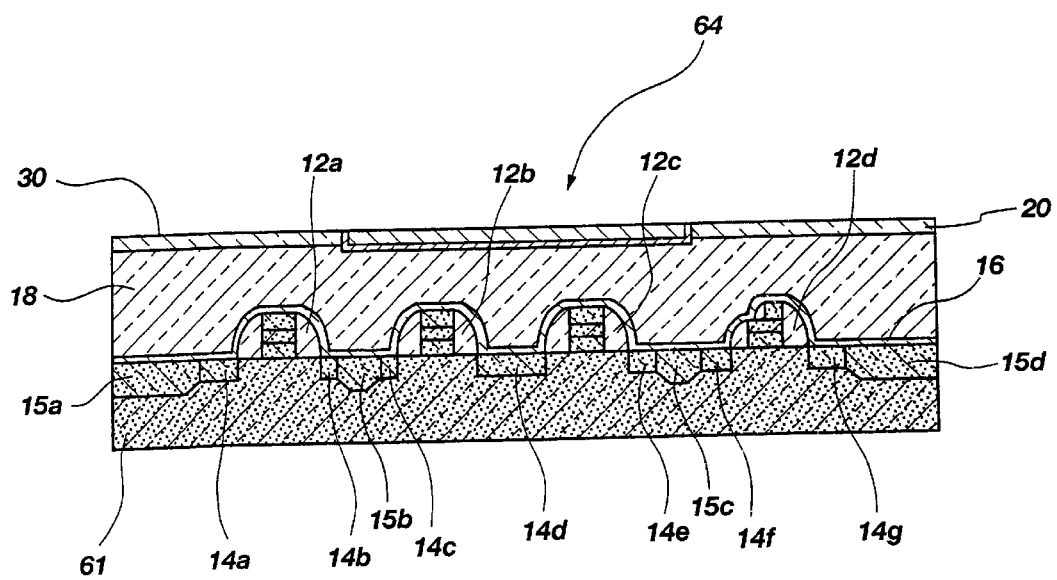

Optionally, where desirable, the trench 62 defining the first interconnect may be filled by first depositing a barrier layer 32 over the trench 62 and the remaining portions of the ILD 20. The barrier layer 32 may include a first conductive material, such as titanium, tungsten, tantalum, titanium nitride, tungsten nitride, or tantalum nitride, and the barrier layer is formed by well-known means in the art. As can be seen in drawing FIG. 23, the barrier layer 32 partially fills the trench 62. After formation of the barrier layer 32, a second conductive layer 34, which completely fills the trench 62, is formed over the barrier layer 32. The second conductive layer 34 may include any suitable material, such as tungsten, and can also be formed using well-known techniques. The barrier layer 32 and the second conductive layer 34 are then polished by suitable means, such as a known CMP process, to again achieve a first portion 64 of a stacked local interconnect, which extends through the ILD 20, but is substantially coplanar with the top surface 30 of the ILD 20 (shown in drawing FIG. 24).

Regardless of whether the first local interconnect 28 is formed using a barrier layer 32 and a second conductive layer or simply a single conductive layer 26, the first portion 64 of the stacked local interconnect can be sized, shaped, and positioned as desired. Preferably, however, the local interconnect is sized, shaped, and positioned such that, after formation of the final stacked local interconnect structure (shown in drawing FIG. 30), the first portion 64 of the stacked local interconnect enables the electrical interconnection of two or more isolated electrical features, such as transistors 12a and 12d.

Figure 25:
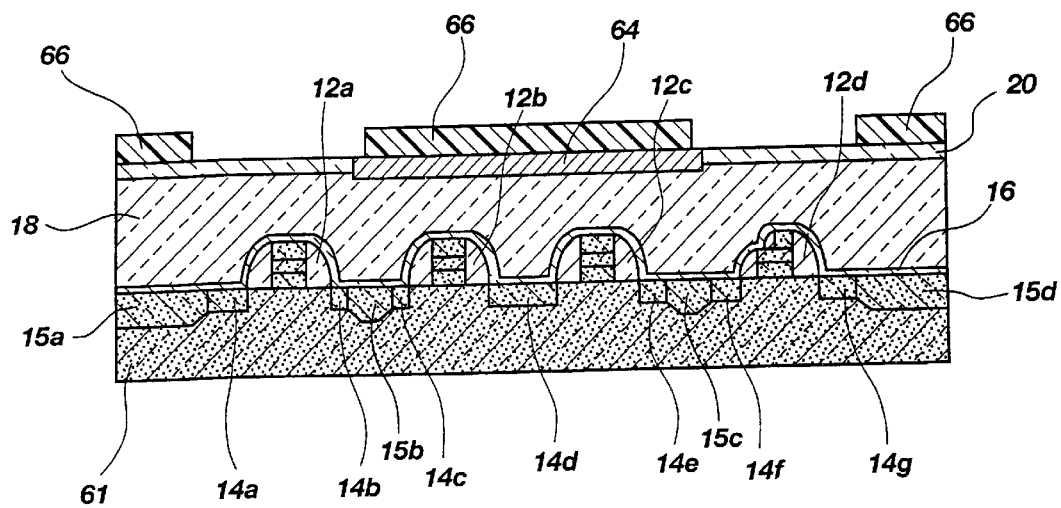

Once the first portion 64 of the stacked local interconnect is formed, a second resist 66 is formed over the semiconductor substrate, as can be seen in drawing FIG. 25. As was true in regard to the first resist 60, any desirable resist material may be used to form the second resist 66. The second resist 66 is exposed and developed according to well-known processes to define the desired shape and location of the second and third portions of the stacked local interconnect.

Figure 26:
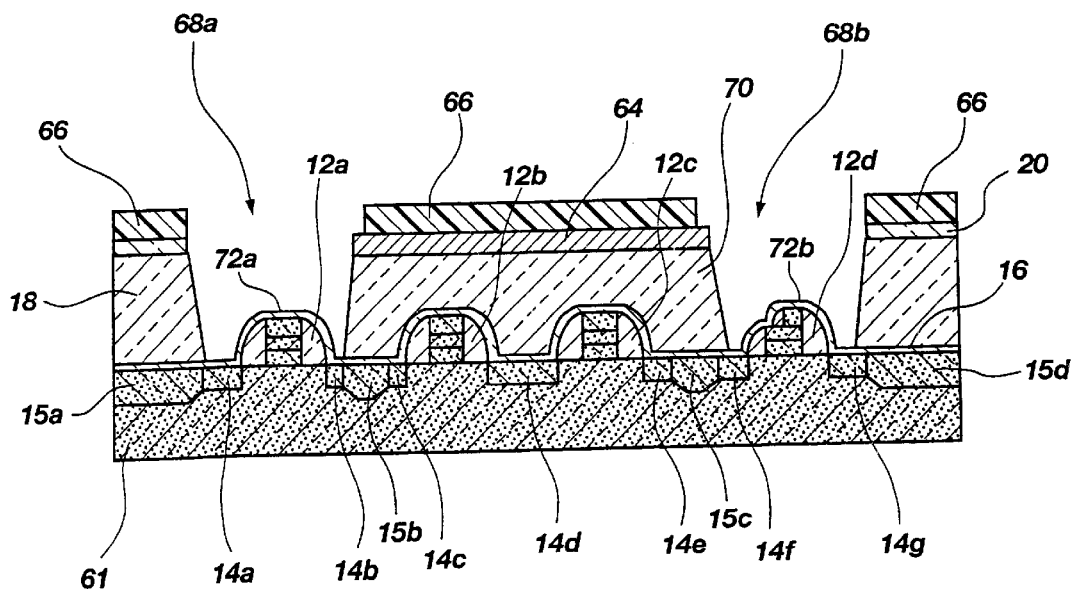

Using the pattern defined in the second resist 66, the ILD 20 and passivation layer 18 are etched to define openings 68a, 68b using a self-aligned contact (SAC) etch, which is selective to the material(s) used in first portion 64 of the stacked local interconnect. As can be appreciated by reference to FIG. 26, the openings 68a, 68b formed by the SAC etch extend down through the passivation layer 18 and expose the electrical features, such as transistors 12a and 12d that are to be electrically connected. Moreover, because the SAC etch is selective to the material used to form the first portion 64 of the stacked local interconnect, the portion 70 of the passivation layer 18 underlying the first portion 64 of the stacked local interconnect remains intact, providing proper isolation for the electrical features and protecting any intervening, unrelated electrical features, such as transistors 12b and 12c, that may be included underneath the first portion 64 of the stacked local interconnect.

In order that the second and third portions of the stacked local interconnect may be formed in electrical contact with the electrical features exposed by openings 68a and 68b, portions of the etch stop layer 16, such as portions 72a and 72b, are first selectively removed by a known etch process. The etch process is preferably a selective plasma dry etch process, such as a "punch etch" process. Illustrated in drawing FIG. 27 is an intermediate IC structure 59 after portions 72a, 72b of the etch stop layer have been removed by a desirable etch process.

Figure 27:
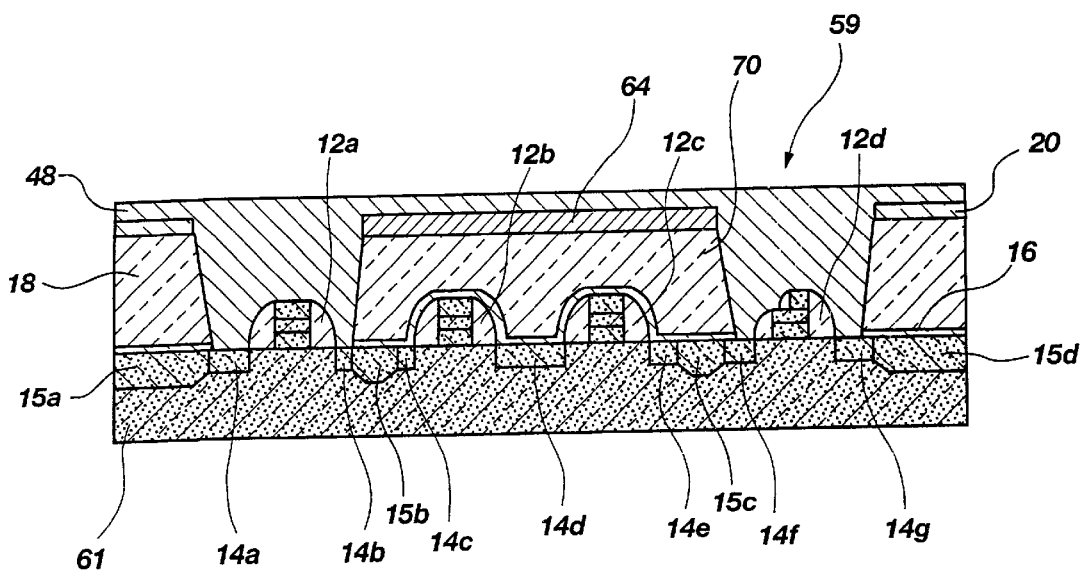

After desired portions of the etch stop layer 16 have been removed to reveal the electrical features to be electrically connected, a layer of conductive material 48 is formed over the openings 68a, 68b, the first portion 64 of the stacked local interconnect and the remaining portions of the ILD 20 (shown in drawing FIG. 27). The layer of conductive material 48 may include any suitable conductive material, though tungsten is presently preferred, and the layer of conductive material 48 may be formed using known deposition processes. As can be appreciated by reference to drawing FIG. 28, the deposited layer of conductive material 48 is then polished as known in the art, such as by a chemical mechanical polishing (CMP) process, to achieve second and third portions 76, 78, which extend through the ILD 20 and passivation layer 18, are in electrical contact with the electronic features, such as transistors 12a and 12d, to be interconnected, are in electrical contact with the first portion 64 of the stacked local interconnect, and are substantially coplanar with the top surface 30 of the ILD 20.

Figure 29:
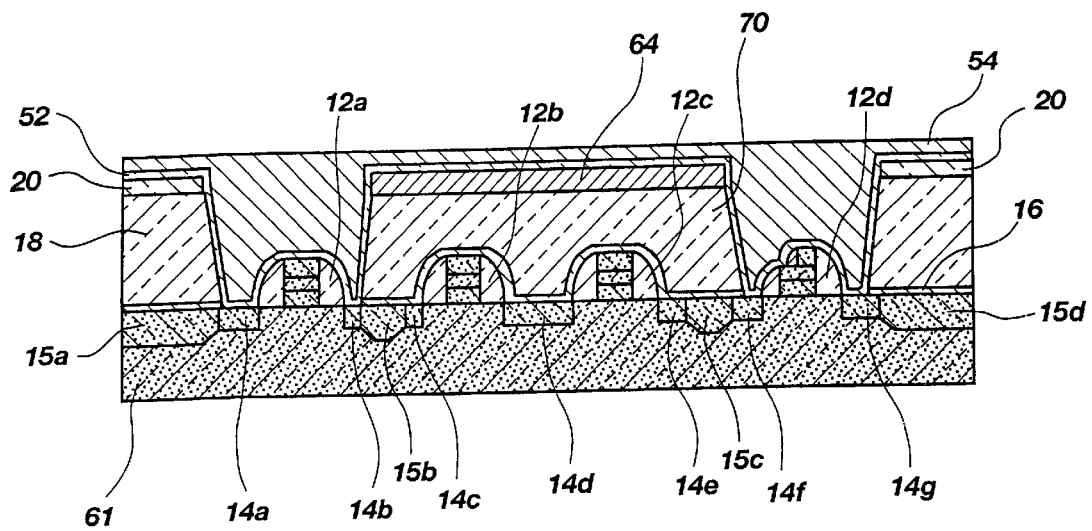

Alternatively, as shown in drawing FIG. 29, the second and third portions 76, 78 of the stacked local interconnect may also be formed by first depositing a barrier layer 52 comprised of any suitable material, such as those materials already described in regard to first portion 64 of the stacked local interconnect. As can be seen in drawing FIG. 29, the barrier layer 52 partially fills openings 68a and 68b. After formation of the barrier layer 52, a second conductive layer 54 is formed over the barrier layer 52. The second conductive layer 54, which can be formed using well-known techniques, completely fills openings 68a and 68b and may include any suitable material, such as tungsten. The barrier layer 52 and the second conductive layer 54 are then polished by suitable means, such as a known CMP process, to achieve second and third portions 76, 78 of the stacked local interconnect, which extend through the ILD 20 and passivation layer 18, are in electrical contact with the electrical features, such as transistors 12a and 12d, to be interconnected, are in electrical contact with the first portion 64 of the local interconnect, and are substantially coplanar with the top surface 30 of the ILD 20 (shown in drawing FIG. 30).

Figure 28:
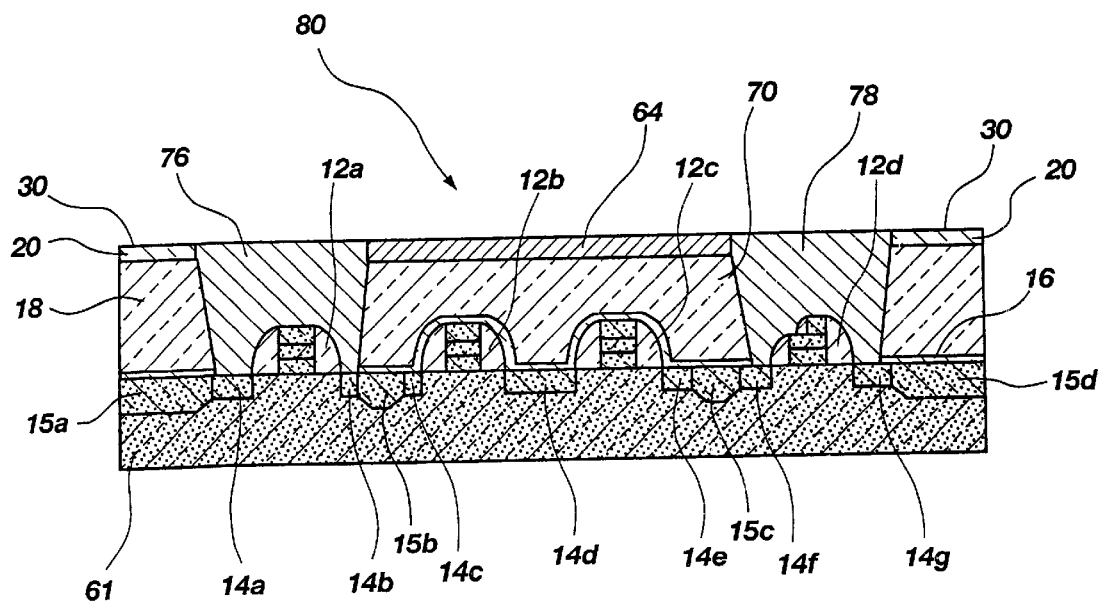
Figure 30:
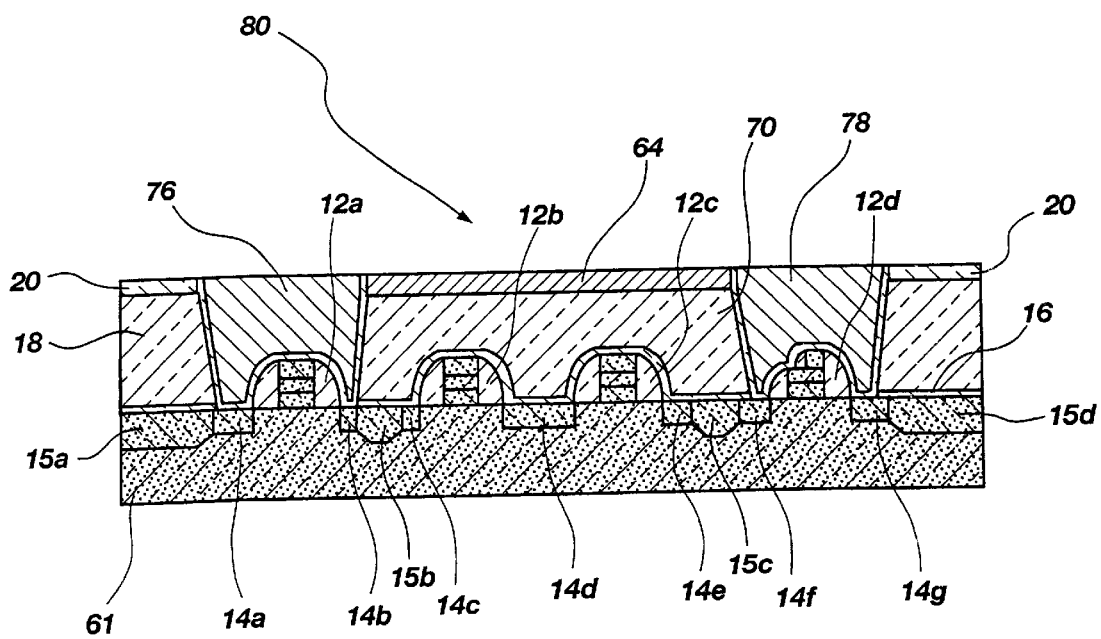

Reference to drawing FIG. 28 and drawing FIG. 30 highlights the second embodiment of the method of the present invention, which provides a stacked local interconnect structure 80 formed of a first portion 64, a second portion 76, and a third portion 78. The stacked local interconnects formed by the second embodiment of the present invention enable the interconnection of two or more isolated electrical features included within a single level of a multilevel semiconductor device. For example, as shown in drawing FIG. 28 and drawing FIG. 30, a first isolated transistor 12a is electrically connected by the stacked local interconnect structure 80 to a second isolated transistor 12d. Moreover, as was true with the stacked local interconnect structures formed in the first embodiment of the method of the present invention, the stacked local interconnects formed by the second embodiment do not include multilevel metallization structures, and the fabrication of the stacked local interconnects is accomplished without contact plugs and the disadvantages that accompany the use of contact plugs. Therefore, the second embodiment of the method of the present invention provides a method for forming stacked local interconnects that facilitates the electrical connection of isolated electrical features, while substantially reducing or eliminating the disadvantages associated with known multilevel interconnect structures.

Though the second embodiment of the method of the present invention has been described herein in relation to a stacked local interconnect structure including three portions electrically connecting two isolated electrical features, the second embodiment of the method of the present invention is extremely flexible and may be used to electrically connect any desired number of isolated electrical features.

Both the first and the second embodiments of the method of the present invention accomplish the interconnection of isolated electrical features without disturbing any unrelated, intervening semiconductor device features. Moreover, the first interconnect formed in the first embodiment and the first portion of the stacked local interconnect formed in the second embodiment protect underlying semiconductor device features from possible damage due to loss of selectivity during subsequent etch steps or due to misalignment of masks used to create the openings used for the second and third interconnects in the first embodiment as well as the second and third portions of the stacked local interconnect of the second embodiment.

Because the SAC etch employed to created such openings is selective to the materials used to form the first local interconnect of the first embodiment or the first portion of the stacked local interconnect of the second embodiment, those features underlying the first local interconnect or first portion of the stacked local interconnect will be protected from damage during the SAC etch, even if the patterned masks used in the SAC step are misaligned or out of position. Therefore, where desired, the first local interconnect of the first embodiment of the method of the present invention or the first portion of the stacked local interconnect of the second embodiment of the method of the present invention may be shaped and positioned to specifically protect underlying semiconductor device features from subsequent fabrication steps. Moreover, even where there is no need for a local interconnect or a stacked local interconnect, a protective overlying metallization layer, such as the first local interconnect of the first embodiment or the first portion of the stacked local interconnect of the second embodiment, may be formed over semiconductor device features to be protected by the processes taught herein. Preferably, such a protective overlying metallization layer would be formed where there is an increased likelihood that subsequent etch steps may lose selectivity or where an error in mask formation would otherwise allow damage to underlying semiconductor device features.

Though the present invention has been described herein with reference to specific examples, such examples are for illustrative purposes only. The scope of the present invention is defined by the appended claims and is, therefore, not limited by the preceding description or the referenced drawings.

What is claimed is:

1. A protection method for features of a semiconductor device during manufacturing operations preventing damage due from inadvertent etching, comprising:

providing a semiconductor substrate including a plurality of device features;

forming a passivation layer over portions of said semiconductor substrate;

forming an interlayer dielectric over said passivation layer;

selecting one or more device features to be protected from said inadvertent etching during said manufacturing operations; and providing a metallization layer over said one or more device features for protection thereof.

2. A protection method for portions of a semiconductor device preventing inadvertent damage from etching during manufacturing operations, said etching, comprising:

providing a semiconductor substrate including a plurality of device features on said portions thereof;

forming a passivation layer over said portions of said semiconductor substrate;

forming an interlayer dielectric over said passivation layer;

selecting one or more device features to be protected from said inadvertent etching during said manufacturing operations; and providing a metallization layer over said one or more device features for protection thereof.

3. A protection method for portions of at least one semiconductor device on a wafer preventing inadvertent damage from etching during manufacturing operations, said etching, comprising:

providing at least one semiconductor device on a wafer including a plurality of device features on said portions thereof;

forming a passivation layer over said portions of said semiconductor device on said wafer;

forming an interlayer dielectric over said passivation layer;

selecting one or more device features to be protected from said inadvertent etching during said manufacturing operations; and providing a metallization layer over said one or more device features for protection thereof.

* * * * *

UNITED STATES PATENT AND TRADEMARK OFFICE
CERTIFICATE OF CORRECTION

PATENT NO. : 6,555,478 B2
DATED : April 29, 2003
INVENTOR(S) : Jigish D. Trivedi It is certified that error appears in the above-identified patent and that said Letters Patent is hereby corrected as shown below:

Title page,
Item [56], References Cited, OTHER PUBLICATIONS, change "2993" to
-- 1993 --

Column 1,
Line 10, change "Nov," to -- Nov. --

Column 10,
Line 36, change "created" to -- create --

Signed and Sealed this

Twenty-third Day of September, 2003

JAMES E. ROGAN
*Director of the United States Patent and Trademark Office*